United States Patent
Jung

(10) Patent No.: US 7,683,401 B2
(45) Date of Patent: Mar. 23, 2010

(54) SEMICONDUCTOR DEVICE AND METHOD OF FABRICATING THEREOF CAPABLE OF REDUCING A SHALLOW TRENCH ISOLATION STRESS INFLUENCE BY UTILIZING LAYOUT PATTERN DESIGNS

(75) Inventor: Myung Jin Jung, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 585 days.

(21) Appl. No.: 11/519,361

(22) Filed: Sep. 12, 2006

(65) Prior Publication Data

US 2007/0057340 A1    Mar. 15, 2007

(30) Foreign Application Priority Data

Sep. 13, 2005  (KR) .................... 10-2005-0085109

(51) Int. Cl.
*H01L 27/088* (2006.01)
(52) U.S. Cl. ............... 257/202; 257/510; 257/E27.105; 257/E27.108
(58) Field of Classification Search ............. 257/510, 257/506, 206, E27.105, E27.108, E29.021, 257/202
See application file for complete search history.

(56) References Cited

U.S. PATENT DOCUMENTS

| | | | | |
|---|---|---|---|---|
| 5,410,161 A | * | 4/1995 | Narita | 257/41 |
| 2003/0127697 A1 | * | 7/2003 | Ohta et al. | 257/390 |
| 2003/0201512 A1 | * | 10/2003 | Yamada et al. | 257/510 |
| 2004/0099924 A1 | * | 5/2004 | Nakata et al. | 257/510 |
| 2004/0238900 A1 | * | 12/2004 | Yamada et al. | 257/401 |
| 2006/0107243 A1 | * | 5/2006 | Chlipala et al. | 716/4 |

* cited by examiner

*Primary Examiner*—Minh-Loan T Tran
(74) *Attorney, Agent, or Firm*—Saliwanchik, Lloyd & Saliwanchik

(57) ABSTRACT

Provided is a semiconductor device. The semiconductor device includes a semiconductor substrate, a plurality of contact metals, and a gate electrode. The semiconductor substrate has an active region and a dummy active region, and a plurality of contact metals are formed in the active region. A gate electrode is located between the contact metals in the active region. A first distance between the active region and the dummy active region, and a second distance between an edge of the contact metal and an edge of the active region are set such that a channel characteristic of the active region is improved.

9 Claims, 19 Drawing Sheets d1=2.6 μm, d2=0.15~0.9 μm d1=0.7 μm, d2=0.15~0.96 μm

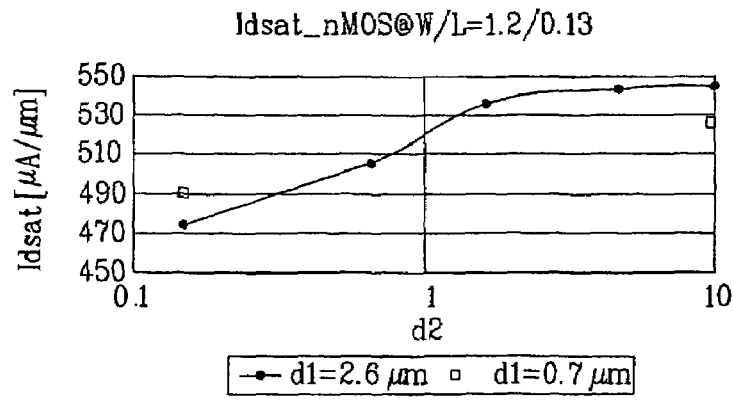
FIG. 2C
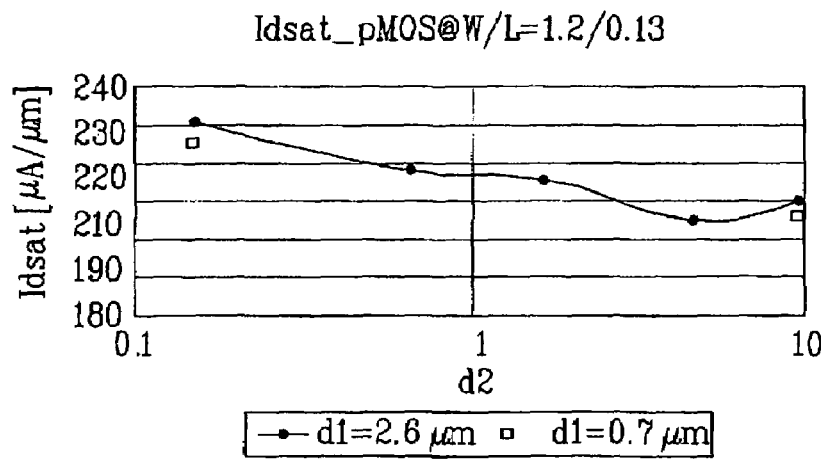
FIG. 2D
| Pattern define | Items | nMOS | pMOS |
|---|---|---|---|
| d2=9.65 μm vs 0.15 μm ratio @ d1=2.6 μm | Vthi | 6.5% ↑ | 3.2% ↓ |
| | Idsat | 13% ↓ | 10% ↑ |
| d2=9.65 μm vs 0.15 μm ratio @ d1=0.7 μm | Vthi | 3.4% ↑ | 0.6% ↓ |
| | Idsat | 7% ↓ | 9.2% ↑ |
FIG. 3

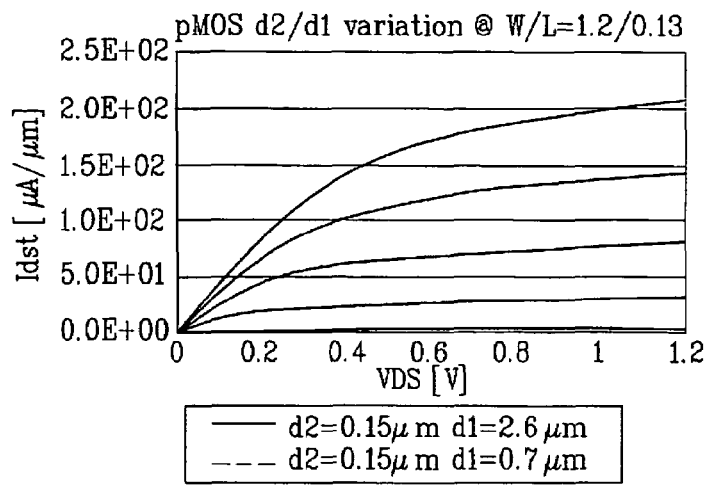
FIG. 6C
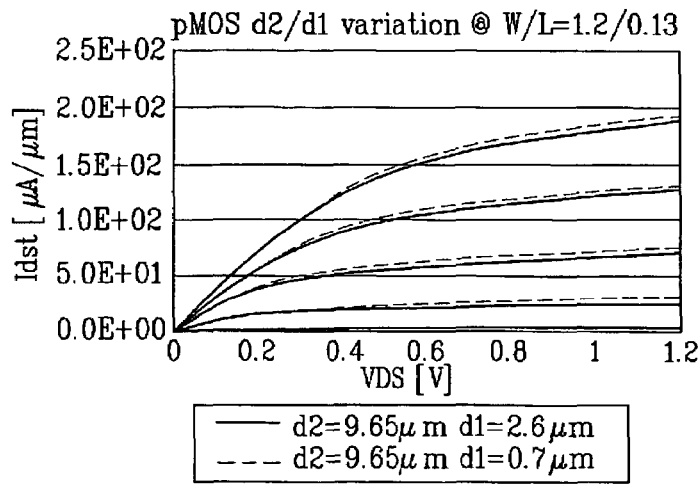
FIG. 6D
| Pattern define | Items | nMOS | pMOS |
|---|---|---|---|
| d1=2.6 μm vs d1=0.7 μm @ d2=9.65 μm | gm | 6% ↓ | 0.8% ↑ |
| | Idsat | 5.5% ↓ | 0.3% ↑ |
| d1=2.6 μm vs d1=0.7 μm @ d2=0.15 μm | gm | 9% ↑ | 3% ↓ |
| | Idsat | 4% ↑ | 2% ↓ |
FIG. 7

| | | nMOS | pMOS | | REMARK |
|---|---|---|---|---|---|
| W/L=10/0.13 μm | Vthi(V) | 0.44 | Vthi(V) | 0.393 | a) d3 = 0.07 μm DUMMY GATE IS NOT PRESENT |
| | Idsat(μA/μm) | 392 | Idsat(μA/μm) | 227 | |
| | Vthi(V) | 0.425 | Vthi(V) | 0.467 | b) d3 = 4.46 μm DUMMY GATE IS NOT PRESENT |
| | Idsat(μA/μm) | 444 | Idsat(μA/μm) | 159 | |
| | Vthi(V) | 0.417 | Vthi(V) | 0.45 | c) d3 = 4.46 μm DUMMY GATE IS PRESENT |
| | Idsat(μA/μm) | 475 | Idsat(μA/μm) | 183 | |
| | Vthi(V) | 0.43 | Vthi(V) | 0.456 | d) d3 = 0.07 μm DUMMY GATE IS PRESENT |
| | Idsat(μA/μm) | 421 | Idsat(μA/μm) | 196 | |

FIG. 9

| Pattern define | Items | nMOS | pMOS |
|---|---|---|---|
| DUMMY GATE ELECTRODE IS NOT PRESENT VS PRESENT @ d3=0.07 μm | gm | 0.5% ↑ | 27% ↓ |
| | Idsat | 7.4% ↑ | 16% ↓ |
| DUMMY GATE ELECTRODE IS NOT PRESENT VS PRESENT @ d3=4.46 μm | gm | 1% ↑ | 11% ↑ |
| | Idsat | 7% ↑ | 15% ↑ |
FIG. 12
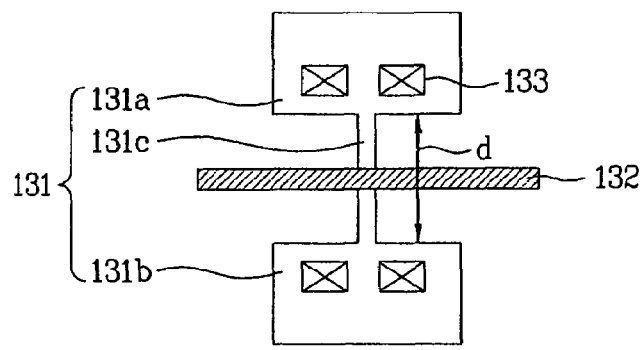
FIG. 13A
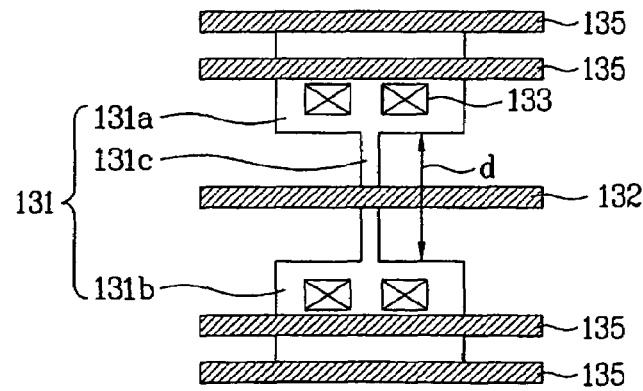
FIG. 13B

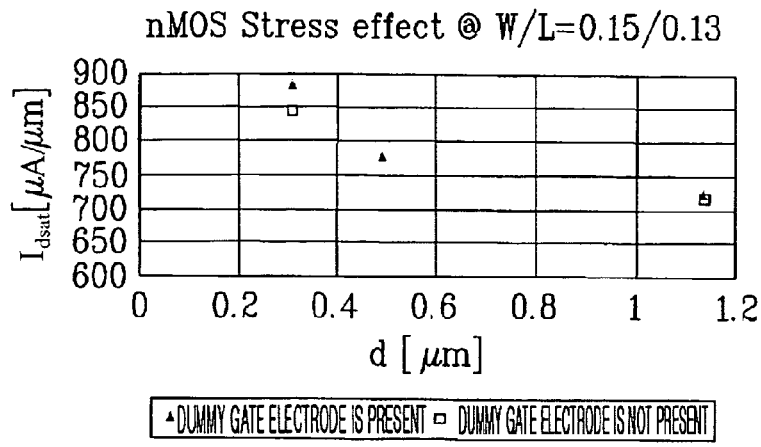
FIG. 14C
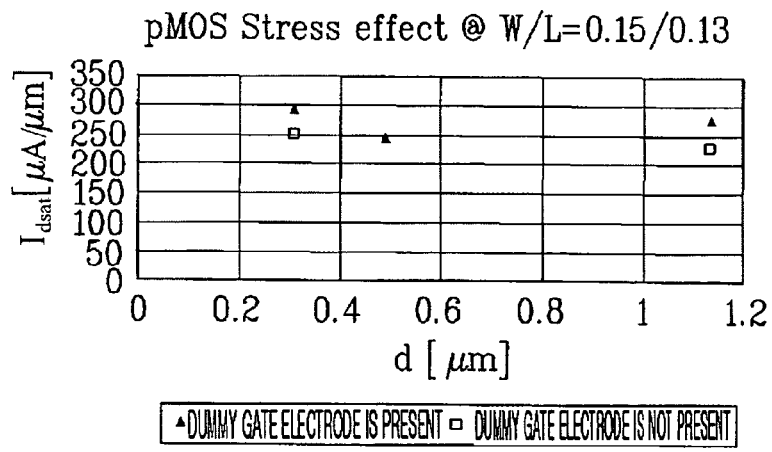
FIG. 14D
| Pattern define | Items | nMOS | pMOS |
|---|---|---|---|
| d=1.13μm vs 0.31 @ DUMMY GATE ELECTRODE IS PRESENT | Vthi | 12% ↓ | 5.5% ↓ |
| | Idsat | 22% ↑ | 6% ↑ |
| d=1.13μm vs 0.31 @ DUMMY GATE ELECTRODE IS NOT PRESENT | Vthi | 12% ↓ | 8% ↓ |
| | Idsat | 18% ↑ | 10% ↑ |
FIG. 15

| Pattern define | ITEM | nMOS | pMOS |
|---|---|---|---|
| DUMMY GATE ELECTRODE IS NOT PRESENT VS PRESENT @ d=0.31μm | gm | 3% ↑ | 19% ↑ |
| | Idsat | 10% ↑ | 20% ↑ |
| DUMMY GATE ELECTRODE IS NOT PRESENT VS PRESENT @ d=1.13μm | gm | 0.5% ↑ | 15% ↑ |
| | Idsat | 8% ↑ | 20% ↑ |

FIG. 18

SEMICONDUCTOR DEVICE AND METHOD OF FABRICATING THEREOF CAPABLE OF REDUCING A SHALLOW TRENCH ISOLATION STRESS INFLUENCE BY UTILIZING LAYOUT PATTERN DESIGNS

RELATED APPLICATION

This application claims the benefit under 35 U.S.C. §119 (e), of Korean Patent Application Number 10-2005-0085109 filed Sep. 13, 2005, which is incorporated herein by reference in its entirety.

FIELD OF THE INVENTION

The present invention relates to a semiconductor device and method of fabricating thereof, and more particularly, to a semiconductor device that can minimize an influence by stress.

BACKGROUND OF THE INVENTION

As complementary metal oxide semiconductor (CMOS) technology miniaturizes, reducing a stress influence is important in improving a device characteristic. In a semiconductor device having a small channel and a narrow width, threshold voltage and drain saturation current sensitively react to the layout of a semiconductor layer, which reduces impurity diffusion and increases carrier mobility under influence of physical stress from a shallow trench isolation (STI).

As the CMOS technology moves towards nano scale miniaturization, characteristics of a metal oxide semiconductor field effect transistor (MOSFET) are increasingly sensitively influenced by the layout pattern of a device.

A threshold voltage $V_{thi}$ of the MOSFET, transconductance gm, and a saturation drain current $I_{dsat}$ represent different characteristics of a MOSFET for a semiconductor layer and a gate electrode of the same size in the MOSFET depending on the kind of STI and chemical vapor deposition (CVD) film.

To solve this problem, many efforts have been made. One of such efforts is to control a drive current using force (i.e., stress caused by compression and tension) applied to a gate electrode due to a CVD film characteristic, and to improve a stress influence using this drive current. However, since NMOS and pMOS drive currents act on each other in an opposite manner in reduction of a stress influence through adjustment of a CVD film layer, such mechanism is not sufficient for optimum reduction of the stress influence. Due to such characteristics, it is difficult to apply the related art to a nano scale reduction requiring a more precise device parameter. Also, this technology cannot solve a stress influence occurring in a predetermined fine pattern after set-up. Even when a drive current is controlled using an implantation method, transistors of an entire chip can be indispensably twisted.

This problem acts as a great obstacle in development of logic circuits or analog circuits of a sub-nano device that has lots of various layout patterns and requires accuracy.

Also, such a characteristic causes a crucial problem that a device parameter cannot be expressed as one parameter set when a spice or a model parameter is extracted.

It is estimated that one of most important reasons causing this problem is mechanical stress generated from an edge of an STI. Since the mechanical stress has a great influence on a device characteristic, it should be reduced.

To reduce a stress influence, a related art has improved device performance by improving electron mobility, hot carrier immunity, and dopant diffusion. Also, there is a report proposing a method of reducing STI stress as a primary method in terms of a junction leakage current increase and stress caused by crystal defects.

However, the present invention reduces a stress influence by modifying a layout pattern, i.e., a pattern design to solve problems indispensably occurring during a process and to achieve a device performance desired by a designer.

To improve this stress influence, patterns designed using three different methods are formed in a mask, and the formed patterns are checked during a silicon forming process.

SUMMARY OF THE INVENTION

Accordingly, the present invention is directed to a semiconductor device that addresses and/or substantially obviates one or more problems, limitations and/or disadvantages of the related art.

A first experiment checks variation of a device characteristic depending on variation in a distance (i.e., an extension active area) between metal 1 contact and an edge of a quadrangular active area within the quadrangular active area, and variation in a distance between dummy active areas adjacent to the active area. A second experiment checks variation of a device characteristic depending on variation of an extension active area in a minimum design rule pattern (for an embodiment example where 0.15/0.13 (=width/length)) and existence of a dummy gate electrode. A third experiment analyzes a device characteristic depending on existence of a dummy gate electrode in an active region having a dog-bone shape to determine a finally optimized pattern design.

An object of the present invention is to provide a semiconductor device that can minimize an STI stress influence using the optimized pattern design.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a semiconductor device including: a semiconductor substrate having an active region and a dummy active region; a plurality of contact metals formed in the active region; and a gate electrode located between the contact metals in the active region, wherein a first distance between the active region and the dummy active region, and a second distance between an edge of the contact metal and an edge of the active region are set such that a channel characteristic of the active region is improved.

In another aspect of the present invention, there is provided a semiconductor device including: an active region formed on a semiconductor substrate; source/drain regions formed in an edge of the active region; a gate electrode formed across a central portion of the active region; and a plurality of dummy gate electrodes arranged on both sides of the gate electrode, wherein a width of the active region is adjusted to a predetermined distance such that a channel characteristic of the active region is improved.

In a further another aspect of the present invention, there is provided a semiconductor device including: a first region having a rectangular shape and a second region having a rectangular shape; a semiconductor substrate having an active region including a third region connecting the first region with the second region; a plurality of contact metals formed in the first region and the second region; a gate electrode formed on the third region; and a plurality of dummy gate electrodes formed on the first and second regions, wherein a length of the third region is adjusted to a predetermined distance such that a channel characteristic of the active region is improved.

In a still further another aspect of the present invention, there is provided a method for manufacturing a semiconductor device, the method including: forming an active region in a semiconductor substrate; forming source/drain regions in an edge of the active region; forming a gate electrode on a portion corresponding to a central portion of the active region; and forming a plurality of dummy gate electrodes arranged on both sides of the gate electrode, wherein a width of the active region is adjusted to a predetermined distance during the forming the active region such that a channel characteristic of the active region is improved.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 2A to 2D are graphs showing variation in a threshold voltage and a drain saturation current of an NMOS transistor and a pMOS transistor depending on sizes of d1 and d2;

FIG. 3 is a table explaining a variation amount in a threshold voltage and a drain saturation current of an nMOS transistor and a pMOS transistor depending on sizes of d1 and d2;

FIGS. 6A to 6D are graphs illustrating a characteristic curve of a transistor;

FIG. 7 is a table illustrating results of FIGS. 5A to 5D, and FIGS. 6A to 6D;

FIG. 9 is a table showing variation in a threshold voltage and a drain saturation current of an nMOS transistor and a pMOS transistor of FIGS. 8A to 8D;

FIG. 12 is a table illustrating variation in a threshold voltage and a drain saturation current of an nMOS transistor and a pMOS transistor depending on existence of a dummy gate;

FIGS. 13A and 13B are views illustrating a transistor according to a further embodiment of the present invention;

FIGS. 14A to 14D are charts illustrating variation in a threshold voltage and a drain saturation current of a transistor depending on a distance between a first region and a second region, and existence of a dummy gate;

FIG. 15 is a table illustrating results of FIGS. 14A to 14D;

FIG. 18 is a table illustrating results of FIGS. 17A to 17D.

DETAILED DESCRIPTION OF THE INVENTION

Reference will now be made in detail to the preferred embodiments of the present invention, examples of which are illustrated in the accompanying drawings.

Figure 1A:
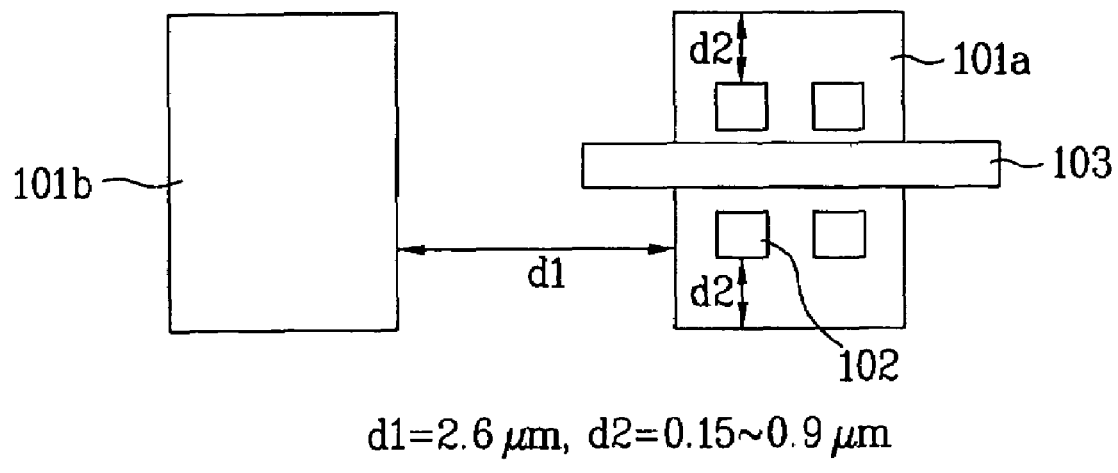
FIGS. 1A and 1B are views illustrating a semiconductor device according to an embodiment of the present invention.
Figure 1B:
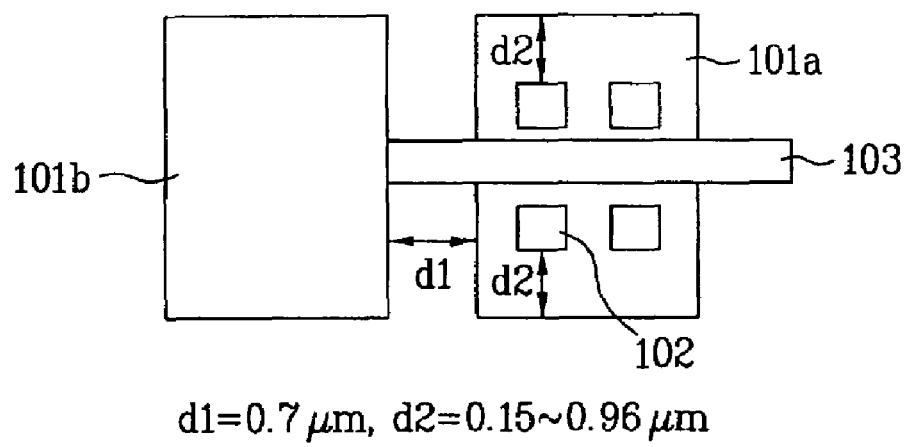
Figure 2A:
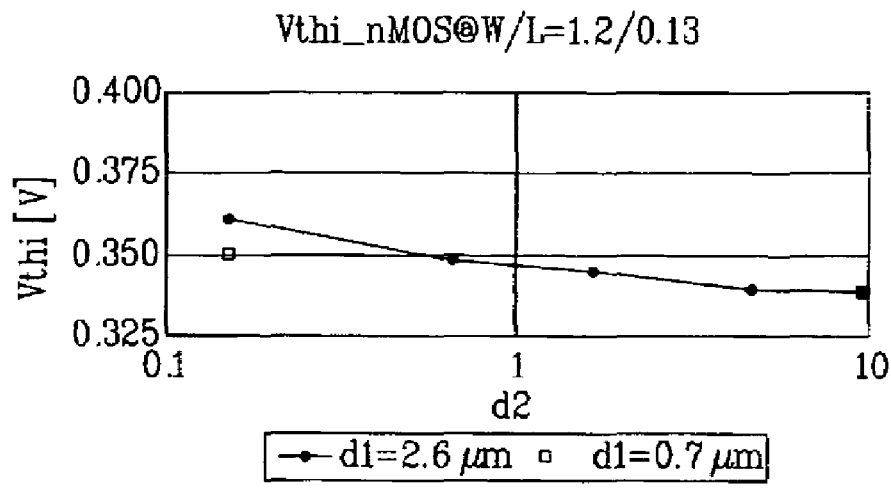
Figure 2B:
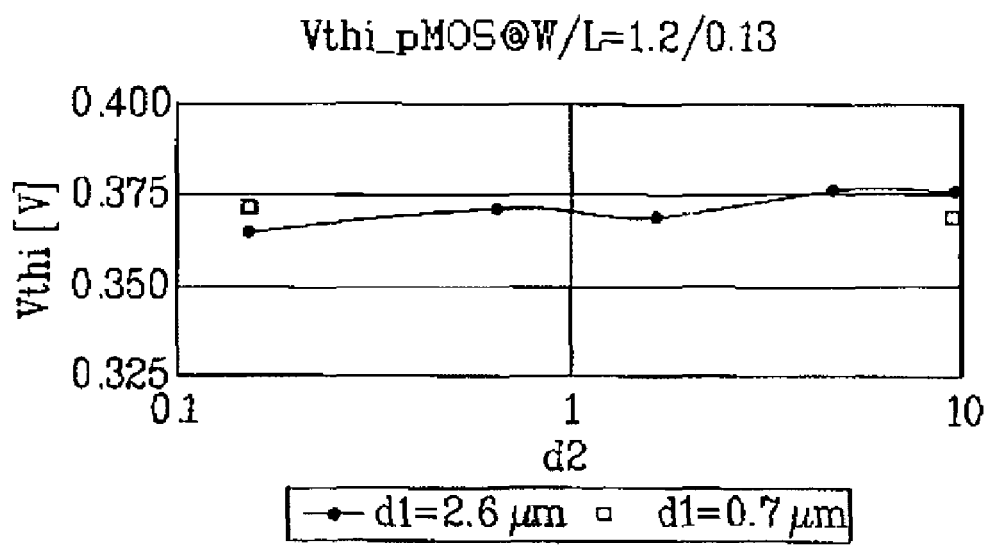
Figure 4A:
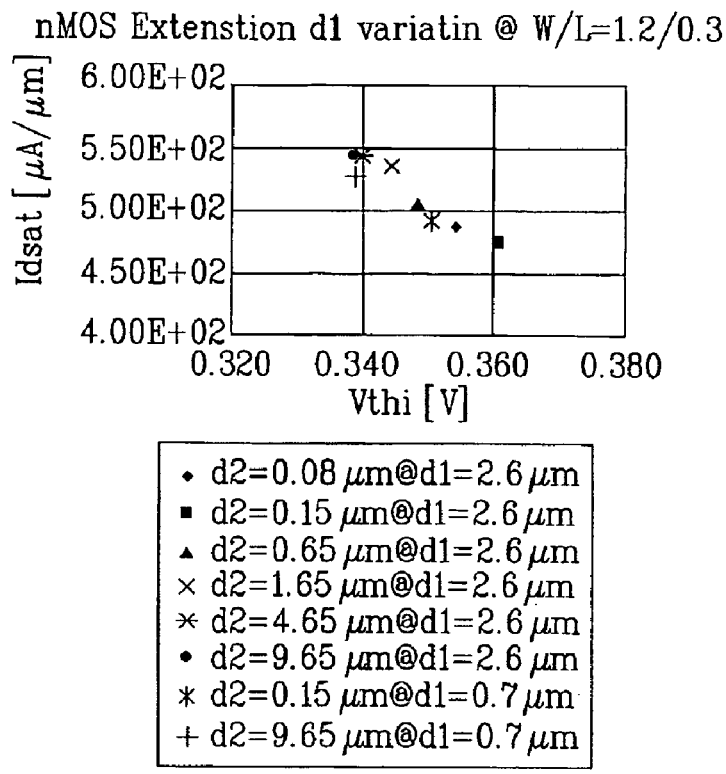
FIGS. 4A and 4B are charts illustrating a variation amount in a threshold voltage and a drain saturation current of an NMOS transistor and a pMOS transistor depending on variation of d1.
Figure 4B:
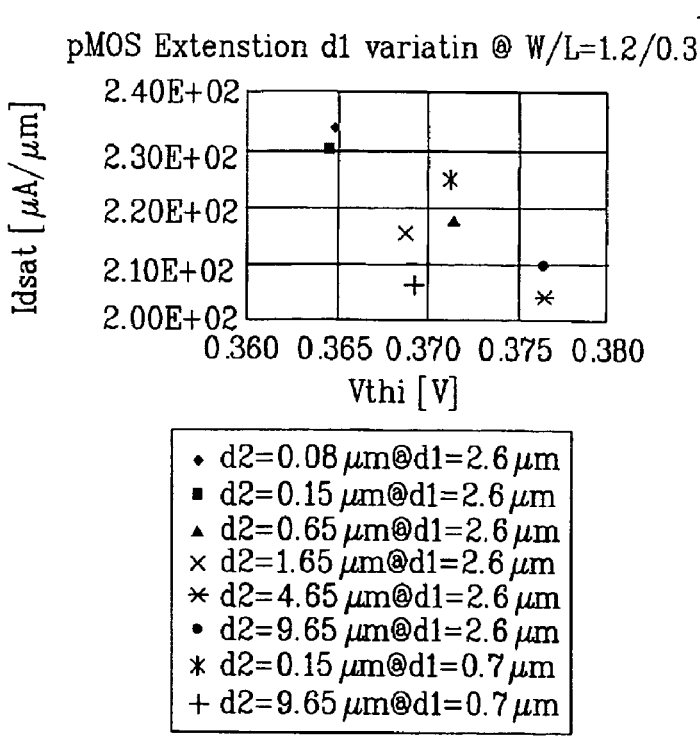

FIGS. 1A and 1B are views illustrating a semiconductor device according to an embodiment of the present invention; FIGS. 2A to 2D are graphs showing variation in a threshold voltage and a drain saturation current of an nMOS transistor and a pMOS transistor depending on sizes of d1 and d2; FIG. 3 is a table explaining a variation amount in a threshold voltage and a drain saturation current of an nMOS transistor and a pMOS transistor depending on sizes of d1 and d2; and FIGS. 4A and 4B are views illustrating a variation amount in a threshold voltage and a drain saturation current of an NMOS transistor and a pMOS transistor depending on variation of d1.

The following discusses a first experiment performed using a device having a rectangular active region.

Referring to FIG. 1A, a distance d1 between the active region 101a and a dummy active region 101b is fixed to 2.6 μm, and a distance d2 between an edge of a contact metal 102 and an edge of the active region 101a is changed in a range of 0.15-9.65 μm. Here, the remaining region excluding the active region 101a and dummy active region 101b has a shallow trench isolation (STI).

Referring to FIG. 1B, a distance d1 between the active region 101a and a dummy active region 101b is fixed to 0.7 μm, and a distance d2 between an edge of a contact metal 102 and an edge of the active region 101a is changed in a range of 0.15-9.65 μm. Here, the remaining region excluding the active region 101a and dummy active region 101b has an STI.

Referring to FIGS. 2A to 2D, on the assumption that a gate electrode 103 is patterned with a length of 0.13 μm and a width of 1.2 μm, in the case of an nMOS transistor, a threshold voltage $V_{thi}$ increases and a drain saturation current $I_{dsat}$ decreases as d1 decreases. In the case of a pMOS transistor, a threshold voltage $V_{thi}$ decreases and a drain saturation current $I_{dsat}$ increases as d1 decreases.

Such results are described below with reference to FIG. 3 and FIGS. 4A-4D.

That is, referring to FIG. 3 and FIG. 4A, a threshold voltage $V_{thi}$ of an NMOS transistor having d1 of 2.6 μm and d2 of 0.15 μm increases by about 6.5% compared to a threshold voltage $V_{thi}$ of an nMOS transistor having d1 of 2.6 μm and d2 of 9.65 μm. Also, a drain saturation current $I_{dsat}$ of an NMOS transistor having d1 of 2.6 μm and d2 of 0.15 μm decreases by about 13% compared to a drain saturation current $I_{dsat}$ of an NMOS transistor having d1 of 2.6 μm and d2 of 9.65 μm.

On the other hand, a threshold voltage $V_{thi}$ of an nMOS transistor having d1 of 0.7 μm and d2 of 0.15 μm increases by about 3.4% compared to a threshold voltage $V_{thi}$ of an nMOS transistor having d1 of 0.7 μm and d2 of 10 μm. Also, a drain saturation current $I_{dsat}$ of an nMOS transistor having d1 of 0.7 μm and d2 of 0.15 μm decreases by about 7% compared to a drain saturation current $I_{dsat}$ of an NMOS transistor having d1 of 0.7 μm and d2 of 10 μm.

As shown in FIG. 3 and FIG. 4B, a threshold voltage $V_{thi}$ of a pMOS transistor having d1 of 2.6 μm and d2 of 0.15 μm decreases by about 3.2% compared to a threshold voltage $V_{thi}$ of a pMOS transistor having d1 of 2.6 μm and d2 of 9.65 μm. Also, a drain saturation current $I_{dsat}$ of a pMOS transistor having d1 of 2.6 μm and d2 of 0.15 μm increases by about 10% compared to a drain saturation current $I_{dsat}$ of a pMOS transistor having d1 of 2.6 μm and d2 of 9.65 μm.

On the other hand, a threshold voltage $V_{thi}$ of a pMOS transistor having d1 of 0.7 μm and d2 of 10 μm increases by about 0.6% compared to a threshold voltage $V_{thi}$ of a pMOS transistor having d1 of 0.7 μm and d2 of 10 μm. Also, a drain saturation current $I_{dsat}$ of a pMOS transistor having d1 of 0.7 μm and d2 of 0.15 μm increases by about 9.2% compared to a drain saturation current $I_{dsat}$ of a pMOS transistor having d1 of 0.7 μm and d2 of 10 μm.

Next, variation in transconductance gm of an NMOS transistor and a PMOS transistor depending on d1 and d2 will be described below.

Figure 5A:
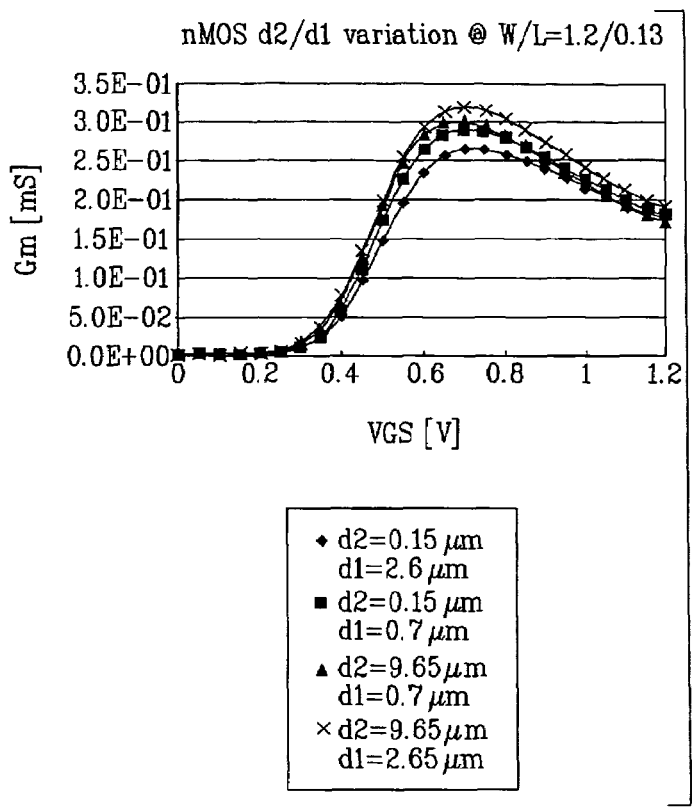
FIGS. 5A and 5B are graphs showing the relation between a gate-source voltage and transconductance in an NMOS transistor and a pMOS transistor depending on sizes of d1 and d2.
Figure 5B:
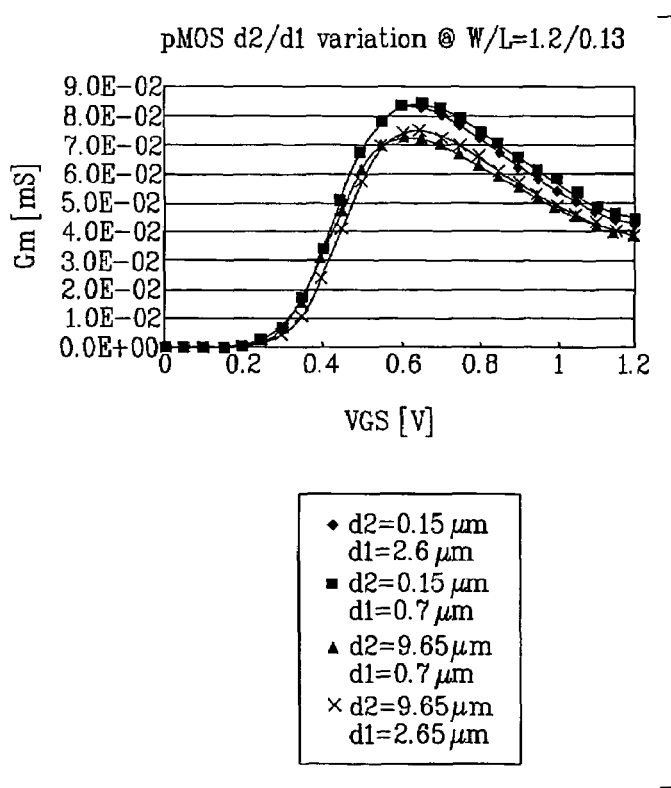

FIGS. 5A and 5B are graphs explaining the relation between a gate-source voltage and transconductance in an nMOS transistor and a pMOS transistor depending on sizes of d1 and d2.

Referring to FIG. 5A and the table of FIG. 7, transconductance gm of an nMOS transistor having d1 of 0.7 μm and d2 of 9.65 μm decreases by about 6% compared to transconductance gm of an nMOS transistor having d1 of 2.6 μm and d2 of 9.65 μm. Also, transconductance gm of an nMOS transistor having d1 of 0.7 μm and d2 of 0.15 μm increases by about 9% compared to transconductance gm of an nMOS transistor having d1 of 2.6 μm and d2 of 0.15 μm.

Referring to FIG. 5B and the table of FIG. 7, transconductance gm of a pMOS transistor having d1 of 0.7 μm and d2 of 9.65 μm increases by about 0.8% compared to transconductance gm of an NMOS transistor having d1 of 2.6 μm and d2 of 9.65 μm. Also, transconductance gm of an NMOS transistor having d1 of 0.7 μm and d2 of 0.15 μm decreases by about 3% compared to transconductance gm of an NMOS transistor having d1 of 2.6 μm and d2 of 0.15 μm.

FIGS. 6A to 6D are graphs illustrating a characteristic curve of a transistor, and FIG. 7 is a table illustrating results of FIGS. 5A-5B as discussed above and FIGS. 6A to 6D.

Figure 6A:
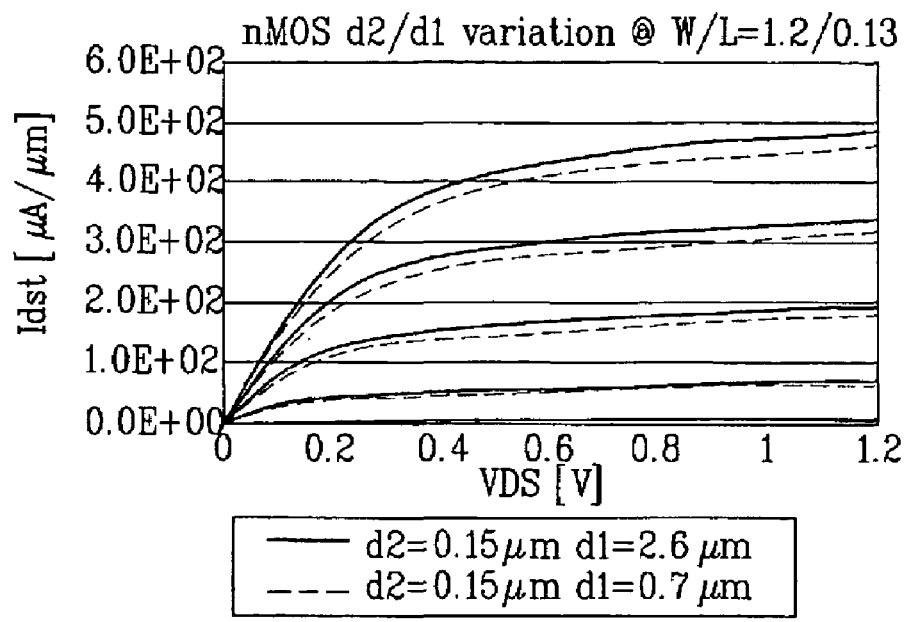
Figure 6B:
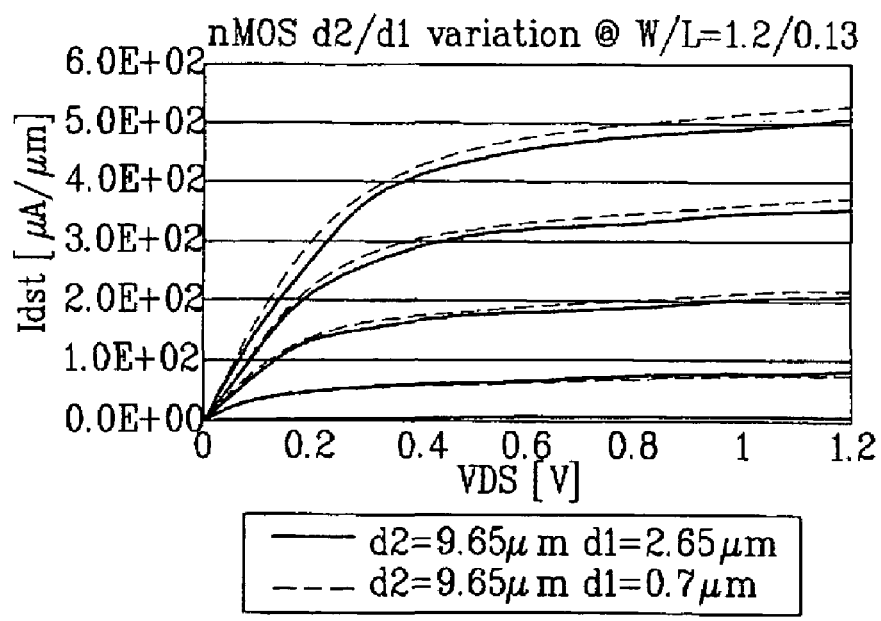

Referring to FIGS. 6A and 7, a drain saturation current $I_{dsat}$ of an nMOS transistor having d1 of 0.7 μm and d2 of 0.15 μm increases by about 4% compared to a drain saturation current $I_{dsat}$ of an nMOS transistor having d1 of 2.6 μm and d2 of 0.15 μm. Referring to FIGS. 6B and 7, a drain saturation current $I_{dsat}$ of an nMOS transistor having d1 of 0.7 μm and d2 of 9.65 μm decreases by about 5.5% compared to a drain saturation current $I_{dsat}$ of an nMOS transistor having d1 of 2.6 μm and d2 of 9.65 μm.

Referring to FIGS. 6C and 7, a drain saturation current $I_{dsat}$ of a pMOS transistor having d1 of 0.7 μm and d2 of 0.15 μm decreases by about 2% compared to a drain saturation current $I_{dsat}$ of a pMOS transistor having d1 of 2.6 μm and d2 of 0.15 μm. Referring to FIGS. 6D and 7, a drain saturation current $I_{dsat}$ of a pMOS transistor having d1 of 0.7 μm and d2 of 9.65 μm increases by about 0.3% compared to a drain saturation current $I_{dsat}$ of a pMOS transistor having d1 of 2.6 μm and d2 of 9.65 μm.

Accordingly, the first experiment shows that a stress effect decreases when a distance between the active region 101a and the dummy active region 101b decreases. In one embodiment of a semiconductor device having a dummy active region, d1 can be selected to be a distance in a range of 0.7-2.6 μm. In a further embodiment, d2 can be selected to be a distance in a range of 0.15-2.6 μm. In another embodiment, d1 can be selected to be 0.7 μm and d2 can be selected to be a distance in a range of 0.15-0.95 μm. In yet another embodiment, d1 can be selected to be 2.6 μm and d2 can be selected to be a distance in a range of 0.15-0.95 μm.

A stress influence of a transistor depending on existence of the dummy gate electrode will be described below using a second experiment.

FIGS. 8A to 8D are views illustrating a semiconductor device according to another embodiment of the present invention.

Figure 8A:
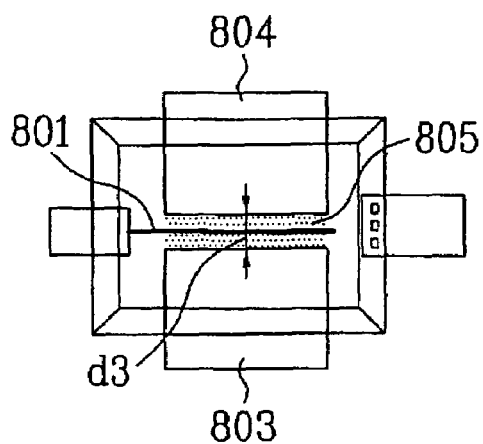
FIGS. 8A to 8D are views illustrating a semiconductor device according to another embodiment of the present invention.
Figure 8B:
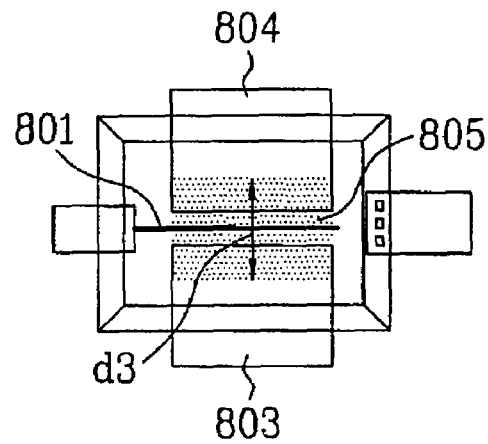
Figure 8C:
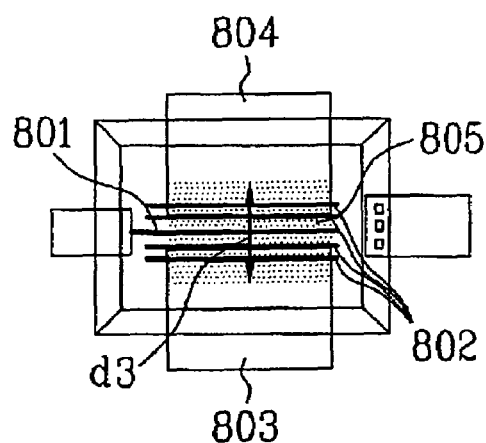
Figure 8D:
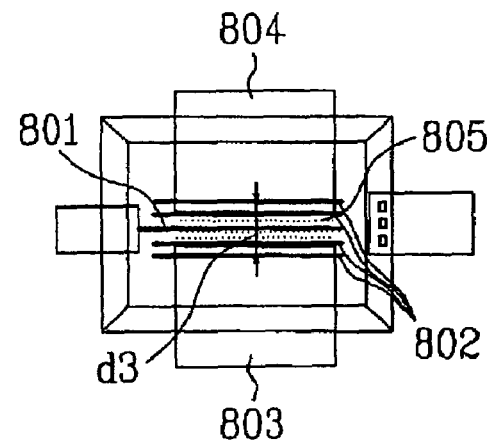

Four cases are described as follows. FIG. 8A illustrates a first case where d3, which a width of an active region 805, is 0.07 μm, and a dummy gate electrode 802 is not present. FIG. 8B illustrates a second case where d3 is 4.66 μm, and the dummy gate electrode 802 is not present. FIG. 8C illustrates a third case where d3 is 4.66 μm, and the dummy gate electrode 802 is present. FIG. 8D illustrates a fourth case where d3 is 0.07 μm, and the dummy gate electrode 802 is present. Reference numerals 803 and 804 are a source electrode and a drain electrode, respectively. Reference numeral 801 is a gate electrode.

FIG. 9 is a table showing variation in a threshold voltage and a drain saturation current of an nMOS transistor and a pMOS transistor of FIGS. 8A to 8D. FIGS. 11A to 11D are graphs illustrating a characteristic curve of a transistor, and FIG. 12 is a table illustrating variation in a threshold voltage and a drain saturation current of an NMOS transistor and a pMOS transistor depending on existence of a dummy gate.

Figure 11A:
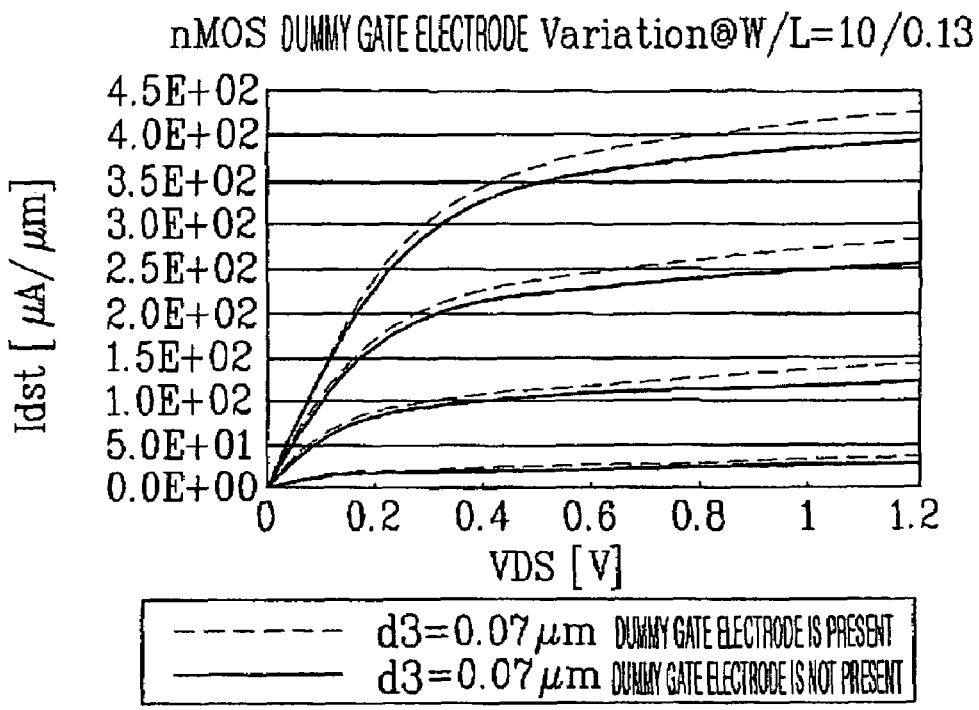
FIGS. 11A to 11D are graphs illustrating a characteristic curve of a transistor.

Referring to FIGS. 9, 11A, and 12, a drain saturation current $I_{dsat}$ of an nMOS transistor having the dummy gate electrode 802 and d3 of 0.07 μm increases by about 7.4% compared to a drain saturation current $I_{dsat}$ of an nMOS transistor having no dummy gate electrode 802 and d3 of 0.07 μm.

Figure 11B:
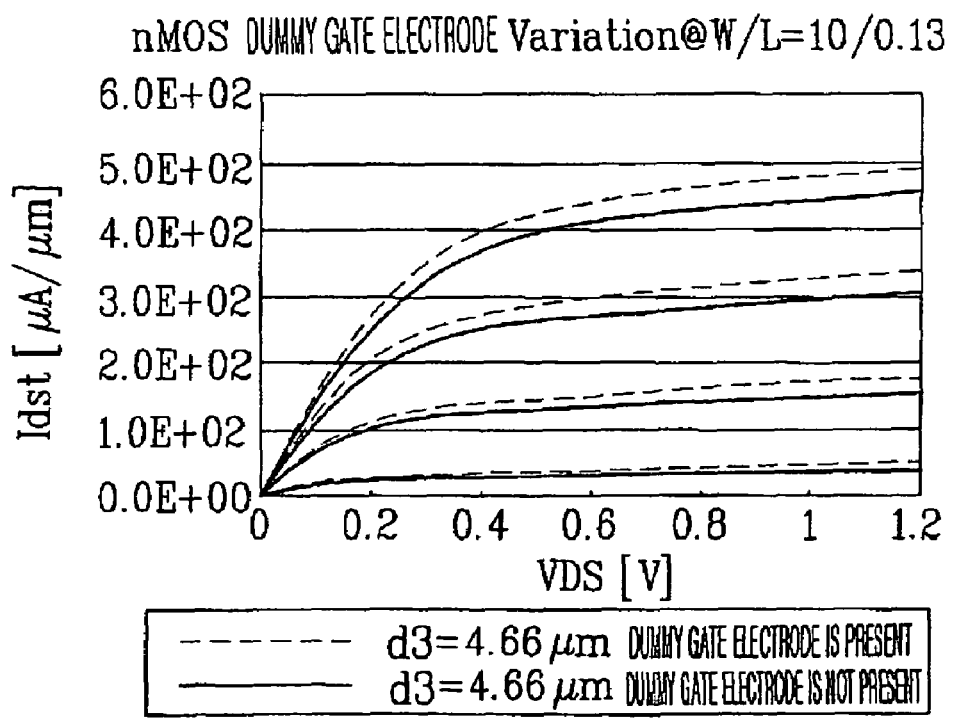

Referring to FIGS. 9, 11B, and 12, a drain saturation current $I_{dsat}$ of an nMOS transistor having the dummy gate electrode 802 and d3 of 4.66 μm increases by about 7% compared to a drain saturation current $I_{dsat}$ of an nMOS transistor having no dummy gate electrode 802 and d3 of 4.66 μm.

Figure 11C:
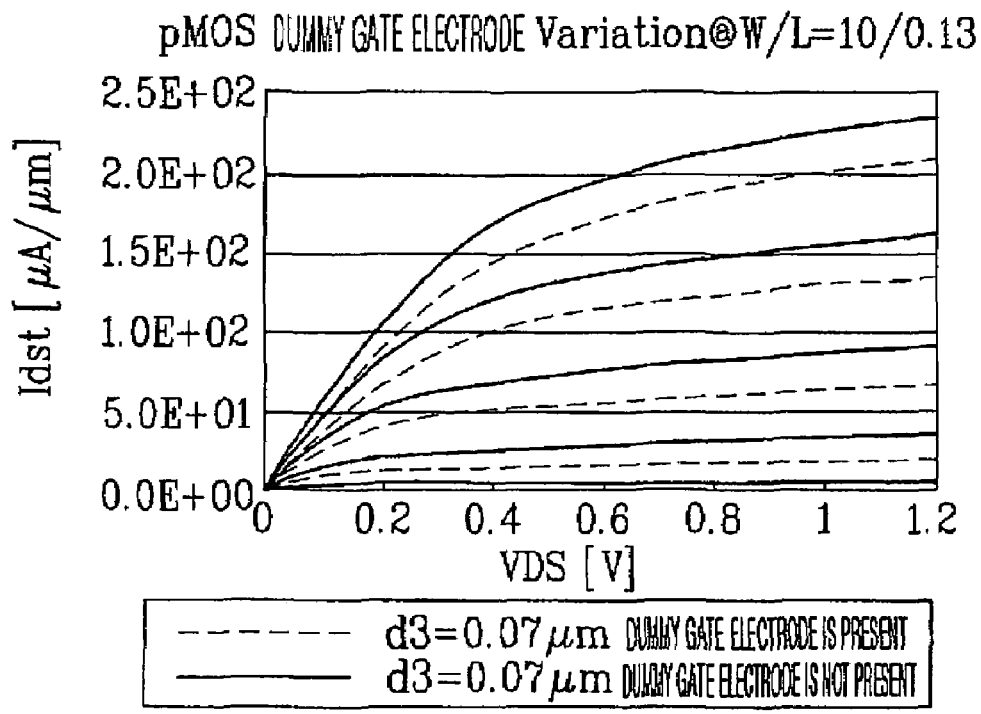

Referring to FIGS. 9, 11C, and 12, a drain saturation current $I_{dsat}$ of a pMOS transistor having the dummy gate electrode 802 and d3 of 0.07 μm decreases by about 16% compared to a drain saturation current $I_{dsat}$ of a pMOS transistor having no dummy gate electrode 802 and d3 of 0.07 μm.

Figure 11D:
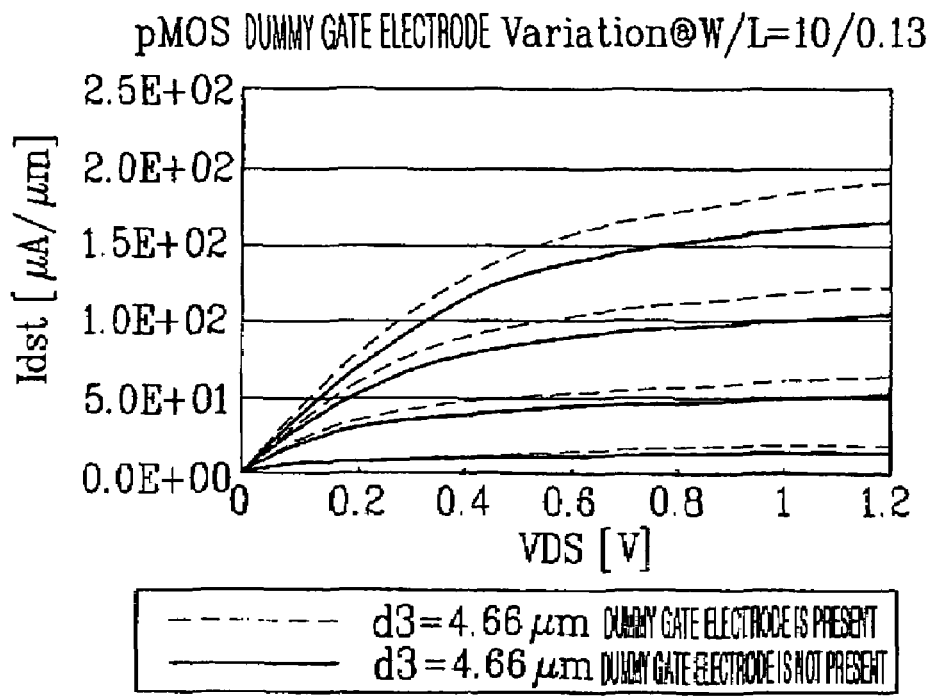

Referring to FIGS. 9, 11D, and 12, a drain saturation current $I_{dsat}$ of a pMOS transistor having the dummy gate electrode 802 and d3 of 4.66 μm increases by about 15% compared to a drain saturation current $I_{dsat}$ of a pMOS transistor having no dummy gate electrode 802 and d3 of 4.66 μm.

As described above, when the dummy gate 802 is present, a stress influence of a transistor decreases.

Next, transconductance gm of an nMOS transistor and a pMOS transistor depending on a size of d3 and existence of the dummy gate electrode 802 will be described below.

Figure 10A:
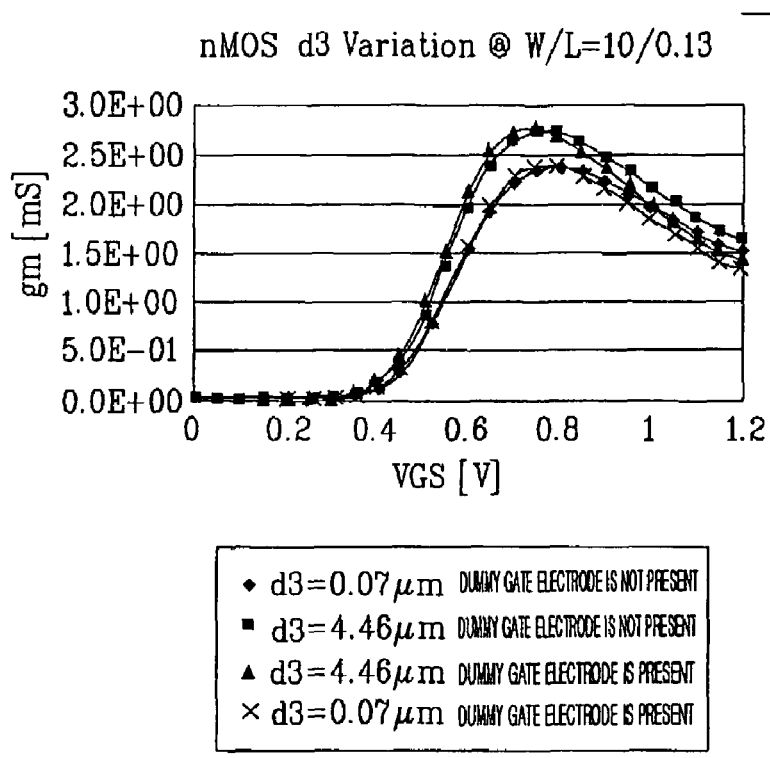
FIGS. 10A and 10B are graphs showing the relation between a gate-source voltage and transconductance in an NMOS transistor and a pMOS transistor depending on a size of d2, and existence of a dummy gate electrode.
Figure 10B:
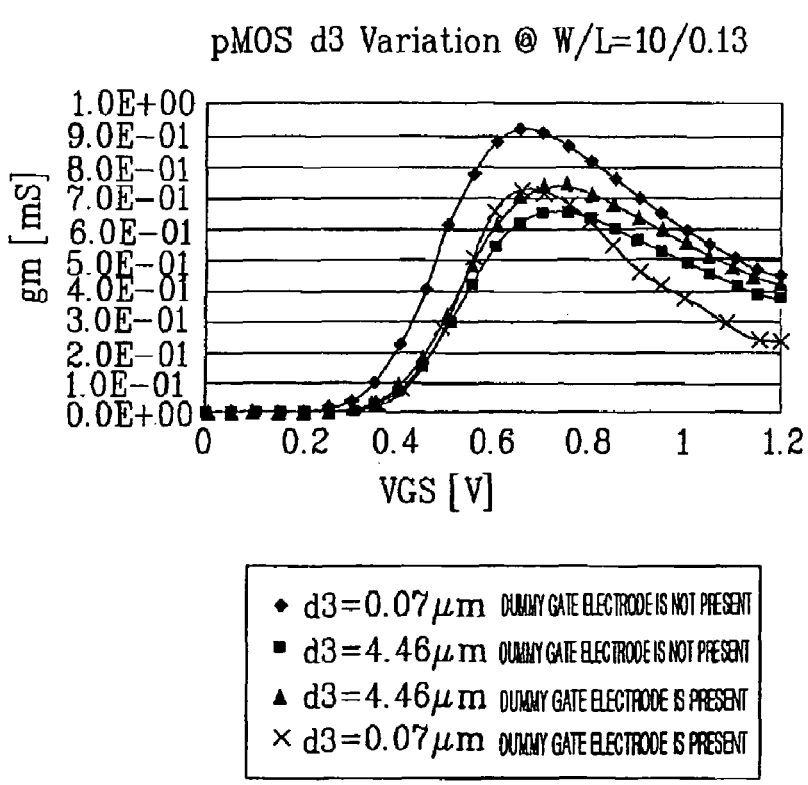

FIGS. 10A and 10B are views explaining the relation between a gate-source voltage and transconductance in an nMOS transistor and a pMOS transistor depending on a size of d3, and existence of a dummy gate electrode.

Referring to FIGS. 10A and 12, transconductance gm of an nMOS transistor having a dummy gate electrode 802 and d3 of 0.07 μm increases by about 0.5% compared to transconductance gm of an nMOS transistor having no dummy gate electrode 802 and d3 of 0.07 μm.

Also, transconductance gm of an nMOS transistor having the dummy gate electrode 802 and d3 of 4.66 μm increases by about 1% compared to transconductance gm of an nMOS transistor having no dummy gate electrode 802 and d3 of 4.66 μm.

Meanwhile, referring to FIGS. 10B and 12, transconductance gm of a pMOS transistor having a dummy gate electrode 802 and d3 of 0.07 μm decreases by about 27% compared to transconductance gm of a pMOS transistor having no dummy gate electrode 802 and d3 of 0.07 μm.

Also, transconductance gm of a pMOS transistor having the dummy gate electrode 802 and d3 of 4.66 μm increases by about 11% compared to transconductance gm of a pMOS transistor having no dummy gate electrode 802 and d3 of 4.66 μm.

Accordingly, the second experiment shows a stress influence of a transistor can be reduced when the dummy gate electrode 802 is used in a transistor. Here, this effect is better applied to a transistor having small d3 rather than a transistor having large d3.

A stress influence of a transistor depending on existence of a dummy gate electrode in the transistor having a dog-bone shaped active region is described below using the third experiment.

FIGS. 13A and 13B are views illustrating a transistor according to a further embodiment of the present invention.

The transistor illustrated in FIG. 13A includes a dog-bone shaped active region 131, and a gate electrode 132 formed on the active region 131. The transistor illustrated in FIG. 13B includes a dog-bone shaped active region 131, a gate electrode 132, and a plurality of dummy gate electrodes 135 formed on the active region 131.

Here, the active region 131 includes rectangular first and second regions 131a and 131b, and a third region 131c connecting the first region 131a with the second region 131b. The third region 131c has a smaller width than those of the first and second regions 131a and 131b. Therefore, the active region 131 has a dog-bone shape.

A plurality of contact metals 133 are formed in the first and second regions 131a and 131b. Though not shown, the contact metal 133 formed in the first region 131a can be connected to a source, and the contact metal 133 formed in the second region 131b can be connected to a drain.

A stress influence of a transistor depending on a distance d between the first region 131a and the second region 131b is described below.

FIGS. 14A to 14D are graphs illustrating variation in a threshold voltage and a drain saturation current of a transistor depending on a distance between a first region and a second region, and existence of a dummy gate. FIG. 15 is a table describing the results of FIGS. 14A to 14D.

Here, a length and a width of a gate of each transistor used in the experiment are 0.13 μm and 0.15 μm, respectively.

Figure 14A:
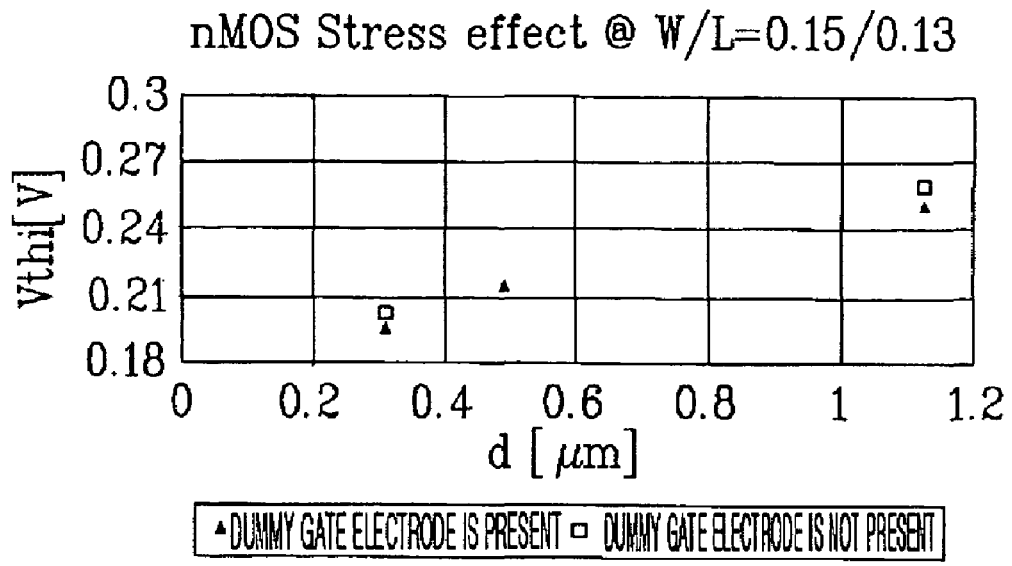

Referring to FIGS. 14A and 14C, as a length d for an nMOS transistor decreases, a threshold voltage $V_{thi}$ decreases and a drain saturation current $I_{dsat}$ increases.

Figure 14B:
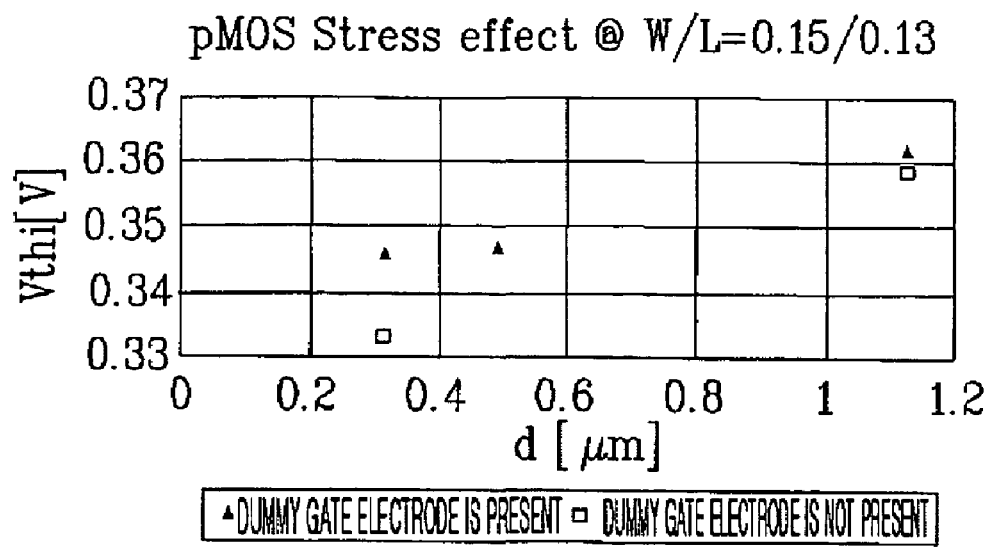

Likewise, referring to FIGS. 14B and 14D, as a length d for a pMOS transistor decreases, a threshold voltage $V_{thi}$ decreases and a drain saturation current $I_{dsat}$ increases.

A stress influence of a transistor depending on existence of the dummy gate electrode 135 will be described below.

Here, as described above, a length and a width of a gate of each transistor used in an experiment are 0.13 μm and 0.15 μm, respectively. Also, a length d for each transistor is 0.31 μm at the minimum and 1.13 μm at the maximum.

Referring to FIG. 14A and FIG. 15, a threshold voltage $V_{thi}$ of an NMOS transistor having a dummy gate electrode 135 and d of 0.31 μm decreases by about 12% compared to a threshold voltage $V_{thi}$ of an NMOS transistor having the dummy gate electrode 135 and d of 1.13 μm. Also referring to FIG. 14C and FIG. 15, a drain saturation current $I_{dsat}$ of an nMOS transistor having the dummy gate electrode 135 and d of 0.31 μm increases by about 22% compared to a drain saturation current $I_{dsat}$ of an NMOS transistor having the dummy gate electrode 135 and d of 1.13 μm.

Referring again to FIG. 14A and FIG. 15, a threshold voltage $V_{thi}$ of an nMOS transistor having no dummy gate electrode 135 and d of 0.31 μm decreases by about 12% compared to a threshold voltage $V_{thi}$ of an nMOS transistor having no dummy gate electrode 135 and d of 1.13 μm. Also as shown in FIG. 14C and FIG. 15, a drain saturation current $I_{dsat}$ of an nMOS transistor having no dummy gate electrode 135 and d of 0.31 μm increases by about 18% compared to a drain saturation current $I_{dsat}$ of an NMOS transistor having no dummy gate electrode 135 and d of 1.13 μm.

Likewise, referring to FIG. 14B and FIG. 15, a threshold voltage $V_{thi}$ of a pMOS transistor having a dummy gate electrode 135 and d of 0.31 μm decreases by about 5.5% compared to a threshold voltage $V_{thi}$ of a pMOS transistor having the dummy gate electrode 135 and d of 1.13 μm. Also, referring to FIG. 14D and FIG. 15, a drain saturation current $I_{dsat}$ of an nMOS transistor having a dummy gate electrode 135 and d of 0.31 μm increases by about 6% compared to a drain saturation current $I_{dsat}$ of an NMOS transistor having a dummy gate electrode 135 and d of 1.13 μm.

Referring again to FIG. 14B and FIG. 15, a threshold voltage $V_{thi}$ of a pMOS transistor having no dummy gate electrode 135 and d of 0.31 μm decreases by about 8% compared to a threshold voltage $V_{thi}$ of a pMOS transistor having no dummy gate electrode 135 and d of 1.13 μm. Also, as shown in FIG. 14D and FIG. 15, a drain saturation current $I_{dsat}$ of a pMOS transistor having no dummy gate electrode 135 and d of 0.31 μm increases by about 10% compared to a drain saturation current $I_{dsat}$ of a pMOS transistor having no dummy gate electrode 135 and d of 1.13 μm.

Furthermore, as shown in FIGS. 14A-14D the threshold voltage $V_{thi}$ and the drain saturation current $I_{dsat}$ have a difference depending on existence of the dummy gate electrode 135.

Consequently, a stress influence depending on the length d in a transistor having a dog-bone shaped gate pattern does not appear to depend on the existence of the dummy gate electrode 135.

Figure 16A:
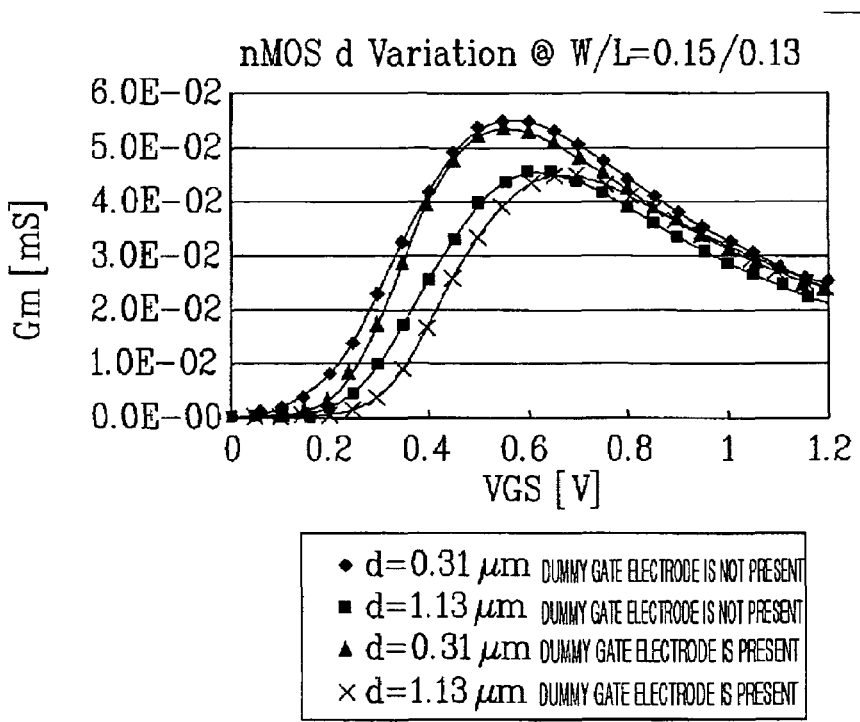
FIGS. 16A and 16B are graphs illustrating variation in a gate-source voltage and transconductance in a transistor depending on a length d.
Figure 16B:
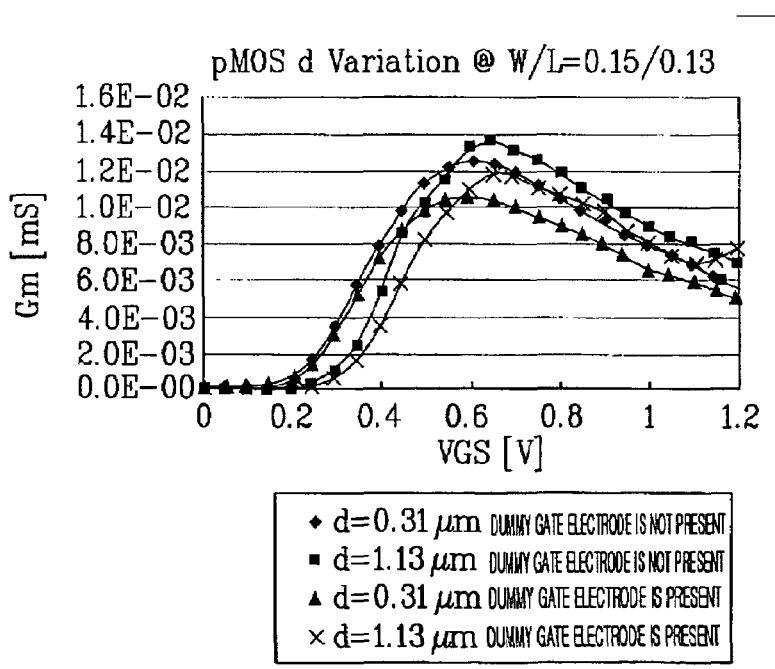

FIGS. 16A and 16B are graphs illustrating variation in a gate-source voltage and transconductance in a transistor depending on a length d.

Referring to FIG. 16A and FIG. 18, transconductance gm of an nMOS transistor not having a dummy gate electrode 135 and d of 0.31 μm increases by about 3% compared to transconductance gm of an nMOS transistor having the dummy gate electrode 135 and d of 0.31 μm.

Also, referring to FIG. 16A and FIG. 18, transconductance gm of an NMOS transistor not having a dummy gate electrode 135 and d of 1.13 μm increases by about 0.5% compared to transconductance gm of an NMOS transistor having the dummy gate electrode 135 and d of 1.13 μm.

Referring to FIG. 16B and FIG. 18, transconductance gm of a pMOS transistor not having a dummy gate electrode 135 and d of 0.31 µm increases by about 19% compared to transconductance gm of a pMOS transistor having the dummy gate electrode 135 and d of 0.31 µm.

Also, referring to FIG. 16B and FIG. 18, transconductance gm of a pMOS transistor not having a dummy gate electrode 135 and d of 1.13 µm increases by about 15% compared to transconductance gm of a pMOS transistor having the dummy gate electrode 135 and d of 1.13 µm.

FIGS. 17A to 17D are graphs illustrating variations in a drain-source voltage and a drain saturation current of a transistor depending on existence of a dummy gate electrode, and FIG. 18 is a table illustrating the results of FIGS. 17A to 17D.

Figure 17A:
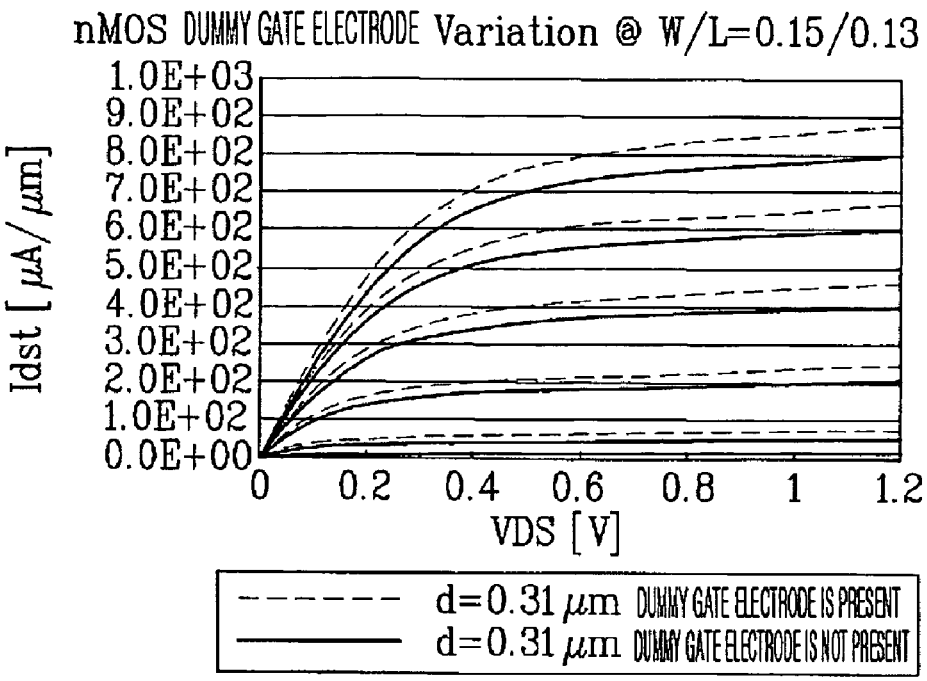
FIGS. 17A to 17D are graphs illustrating variations in a drain-source voltage and a drain saturation current of a transistor depending on existence of a dummy gate electrode.

Referring to FIGS. 17A and 18, a drain saturation current $I_{dsat}$ of an NMOS transistor having a dummy gate electrode 135 and d of 0.31 µm increases by about 10% compared to a drain saturation current $I_{dsat}$ of an nMOS transistor having no dummy gate electrode 135 and d of 0.31 µm.

Figure 17B:
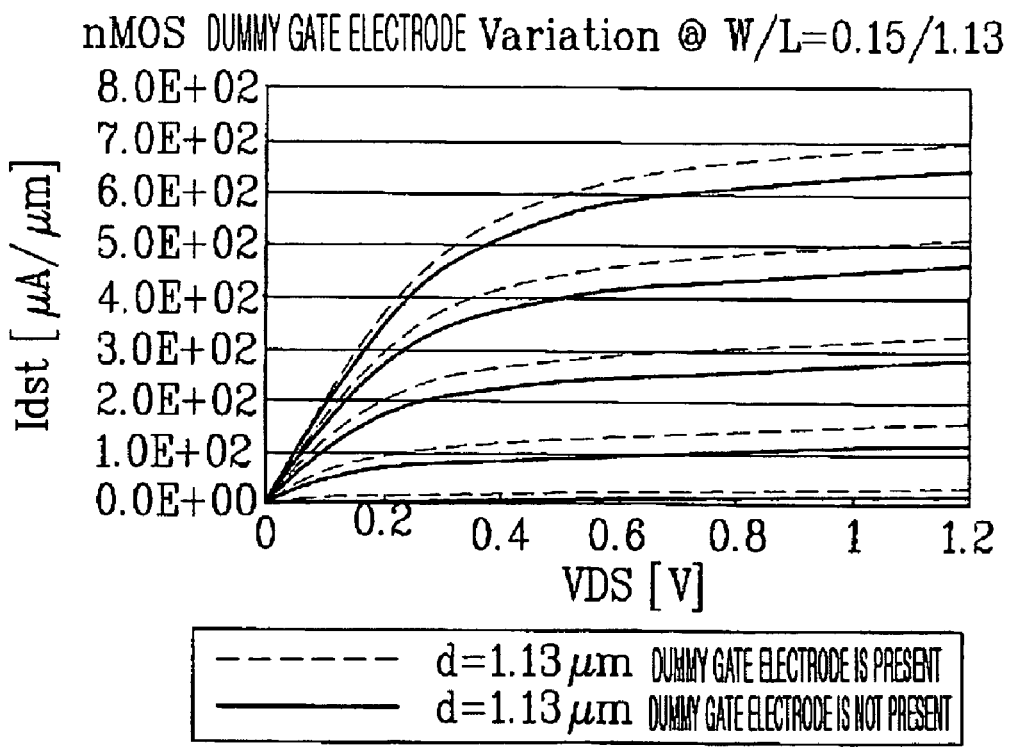

Also, referring to FIGS. 17B and 18, a drain saturation current $I_{dsat}$ of an NMOS transistor having a dummy gate electrode 135 and d of 1.13 µm increases by about 8% compared to a drain saturation current $I_{dsat}$ of an nMOS transistor having no dummy gate electrode 135 and d of 1.13 µm.

Figure 17C:
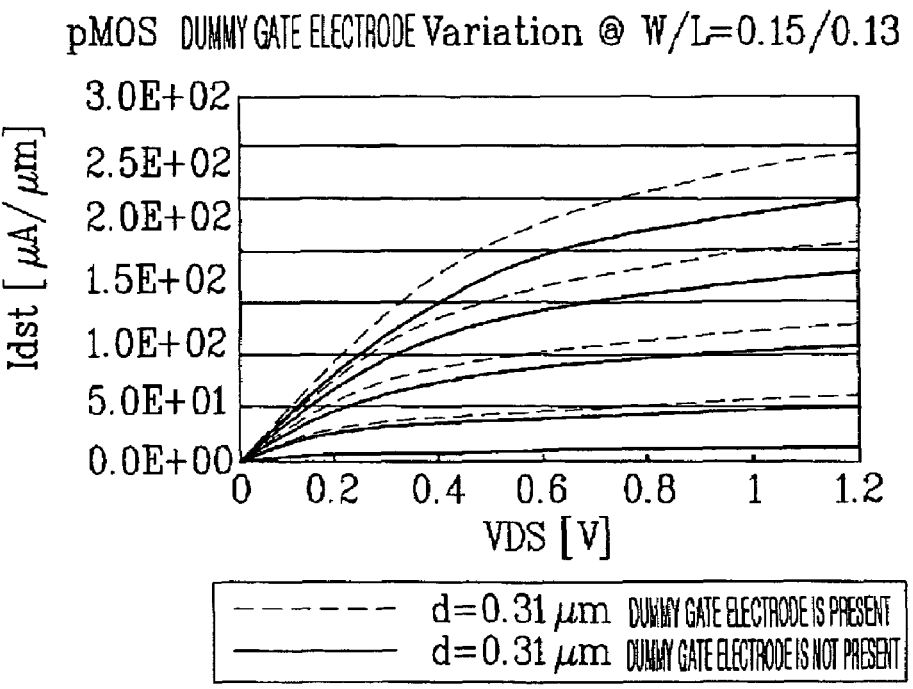

Also, referring to FIGS. 17C and 18, a drain saturation current $I_{dsat}$ of a pMOS transistor having a dummy gate electrode 135 and d of 0.31 µm increases by about 20% compared to a drain saturation current $I_{dsat}$ of a pMOS transistor having no dummy gate electrode 135 and d of 0.31 µm.

Figure 17D:
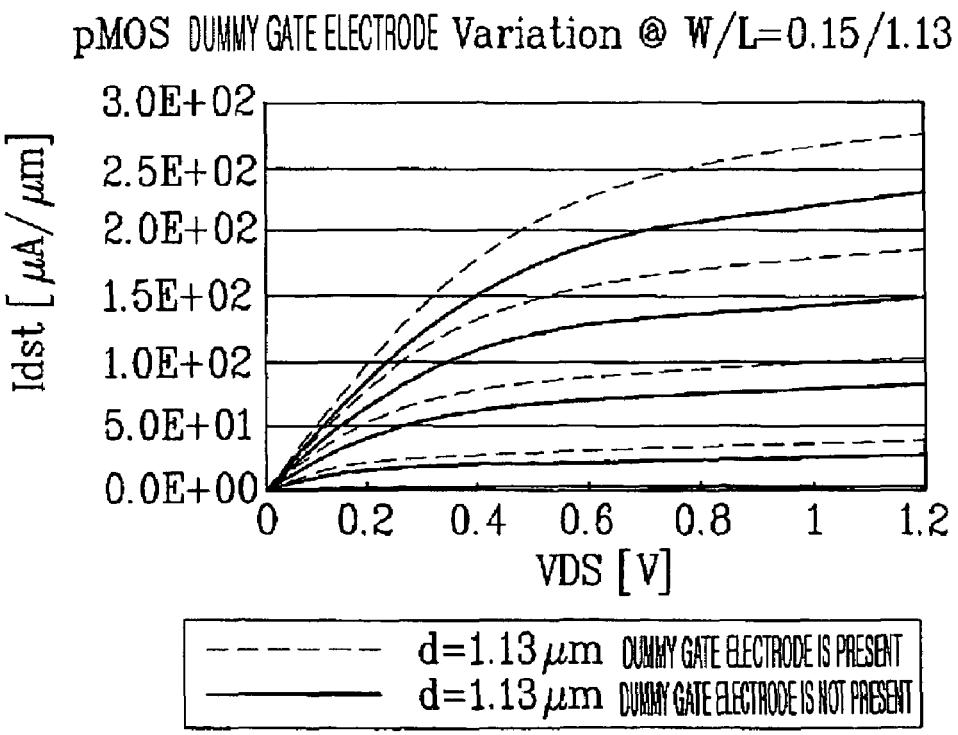

Also, referring to FIGS. 17D and 18, a drain saturation current $I_{dsat}$ of a pMOS transistor having a dummy gate electrode 135 and d of 1.13 µm increases by about 20% compared to a drain saturation current $I_{dsat}$ of a pMOS transistor having no dummy gate electrode 135 and d of 1.13 µm.

Consequently, when the length d decreases, a drain saturation current $I_{dsat}$ of an nMOS transistor and a pMOS transistor increases in a transistor having a dog-bone shaped active region 131. Also, when the length d decreases, a drain saturation current $I_{dsat}$ of an NMOS transistor and a pMOS transistor increases in a transistor having a dog-bone shaped gate pattern even though the dummy gate electrode 135 is present.

The above-described semiconductor device according to the present invention has the following effect.

That is, a distance between an active region and a dummy active region, a distance between an edge of an active region and an edge of a contact metal, and a distance between a first region and a second region in a dog-bone shaped active region are optimized, so that a stress influence of a device is minimized.

It will be apparent to those skilled in the art that various modifications and variations can be made in the present invention. Thus, it is intended that the present invention covers the modifications and variations of this invention provided they come within the scope of the appended claims and their equivalents.

I claim:

1. A semiconductor device comprising:
   a semiconductor substrate having an active region and a dummy active region;
   a plurality of contact metals formed in the active region; and
   a gate electrode located between the contact metals in the active region, wherein a first distance between the active region and the dummy active region, and a second distance between an edge of the contact metal and an edge of the active region are set such that a channel characteristic of the active region improves.

2. The semiconductor device according to claim 1, wherein the channel characteristic of the active region increases impurity diffusion and carrier mobility.

3. The semiconductor device according to claim 1, wherein the first distance is in a range of 0.7-2.6 µm, and the second distance is in a range of 0.15-2.6 µm.

4. The semiconductor device according to claim 1, wherein the first distance between the active region and the dummy active region is 0.7 µm, and the second distance between an edge of the contact metal and an edge of the active region is in a range of 0.15-0.95 µm.

5. The semiconductor device according to claim 1, wherein the first distance between the active region and the dummy active region is 2.6 µm, and the second distance between an edge of the contact metal and an edge of the active region is in a range of 0.15-0.95 µm.

6. The semiconductor device according to claim 1, wherein a threshold voltage and a drain saturation current of a transistor realized in the active region are controlled by controlling the first and second distances.

7. The semiconductor device according to claim 1, wherein a gain and a drain saturation current of a transistor realized in the active region are controlled depending on existence of the dummy active region.

8. A semiconductor device comprising:
   an active region formed on a semiconductor substrate;
   source/drain regions formed in an edge of the active region;
   a gate electrode formed across a central portion of the active region; and
   a plurality of dummy gate electrodes arranged on both sides of the gate electrode, wherein a width of the active region is adjusted to a predetermined distance such that a channel characteristic of the active region improves, wherein the plurality of dummy gate electrodes are arranged on both sides of the gate electrode such that the dummy gate electrodes are overlapping with electrodes of the source/drain regions.

9. The semiconductor device according to claim 8, wherein the width of the active region is in a range of 0.07-4.66 µm.

* * * * *